US009728718B2

(12) United States Patent
Machkaoutsan et al.

(10) Patent No.: US 9,728,718 B2
(45) Date of Patent: Aug. 8, 2017

(54) MAGNETIC TUNNEL JUNCTION (MTJ) DEVICE ARRAY

(71) Applicant: QUALCOMM Incorporated, San Diego, CA (US)

(72) Inventors: Vladimir Machkaoutsan, Leuven (BE); Matthias Georg Gottwald, Heverlee (BE); Mustafa Badaroglu, Leuven (BE); Jimmy Kan, San Diego, CA (US); Kangho Lee, San Diego, CA (US); Yu Lu, San Diego, CA (US); Chando Park, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/389,322

(22) Filed: Dec. 22, 2016

(65) Prior Publication Data

US 2017/0104153 A1     Apr. 13, 2017

Related U.S. Application Data

(63) Continuation of application No. 14/609,169, filed on Jan. 29, 2015.

(51) Int. Cl.
| | |
|---|---|
| *H01L 43/12* | (2006.01) |
| *H01L 27/22* | (2006.01) |
| *H01L 43/02* | (2006.01) |
| *H01L 43/08* | (2006.01) |

(52) U.S. Cl.
CPC ............ *H01L 43/12* (2013.01); *H01L 27/228* (2013.01); *H01L 43/02* (2013.01); *H01L 43/08* (2013.01)

(58) Field of Classification Search
CPC .................................................... H01L 27/222
See application file for complete search history.

(56) References Cited

U.S. PATENT DOCUMENTS

| | | | |
|---|---|---|---|
| 6,724,653 B1 | 4/2004 | Iwata et al. | |
| 6,815,784 B2 | 11/2004 | Park et al. | |
| 7,183,130 B2 | 2/2007 | Nuetzel et al. | |
| 7,211,446 B2 | 5/2007 | Gaidis et al. | |
| 8,374,020 B2 | 2/2013 | Katti | |
| 8,804,413 B2 | 8/2014 | Li et al. | |
| 2009/0067231 A1 | 3/2009 | Mani | |
| 2010/0220516 A1* | 9/2010 | Lee | G11C 11/16 365/158 |
| 2012/0193736 A1* | 8/2012 | Mather | G01R 33/098 257/421 |
| 2013/0037862 A1 | 2/2013 | Kitagawa et al. | |
| 2013/0114336 A1 | 5/2013 | Li et al. | |
| 2013/0258750 A1 | 10/2013 | Kim et al. | |

(Continued)

FOREIGN PATENT DOCUMENTS

WO      2005043545 A1     5/2005

OTHER PUBLICATIONS

International Search Report and Written Opinion—PCT/US2015/067350—ISA/EPO—Mar. 29, 2016.

*Primary Examiner* — Lex Malsawma
(74) *Attorney, Agent, or Firm* — Toler Law Group, PC.

(57) ABSTRACT

A semiconductor device includes a first magnetic tunnel junction (MTJ) device, a second MTJ device, and a top electrode. The first MTJ device includes a barrier layer. The second MTJ device includes the barrier layer. The top electrode is coupled to the first MTJ device and the second MTJ device.

20 Claims, 10 Drawing Sheets

(56) References Cited

U.S. PATENT DOCUMENTS

2014/0231941 A1    8/2014   Lee et al.
2015/0011093 A1*   1/2015   Singh ................ H01J 37/32422
                                                                   438/712
2016/0225817 A1    8/2016   Machkaoutsan et al.

* cited by examiner

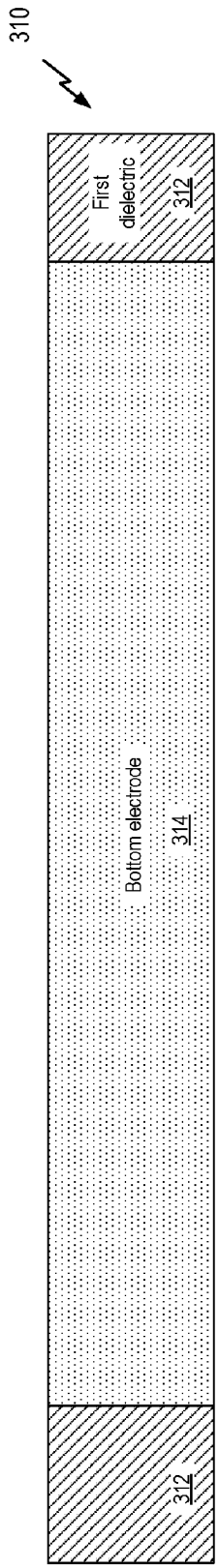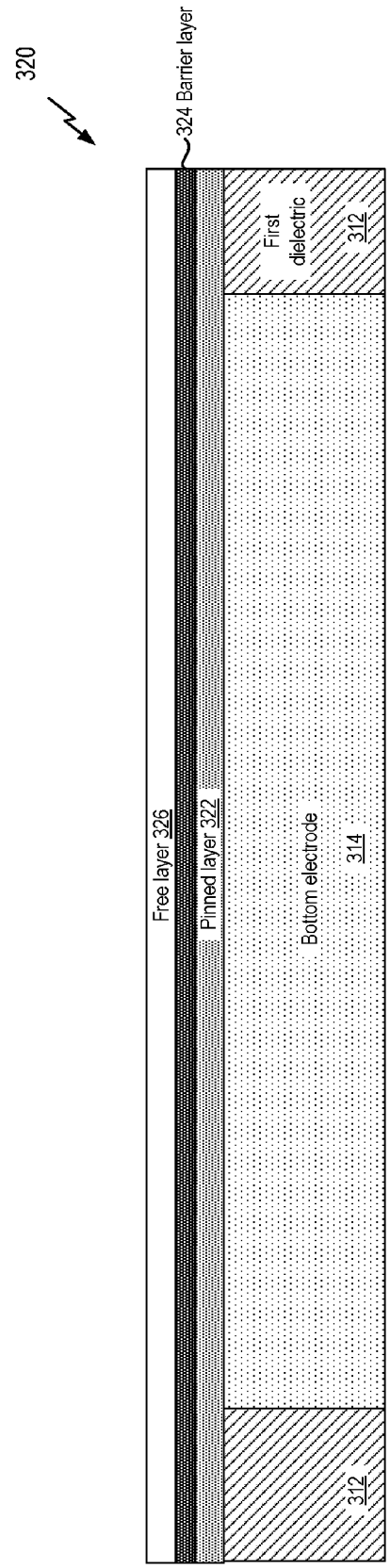
FIG. 3A
FIG. 3B

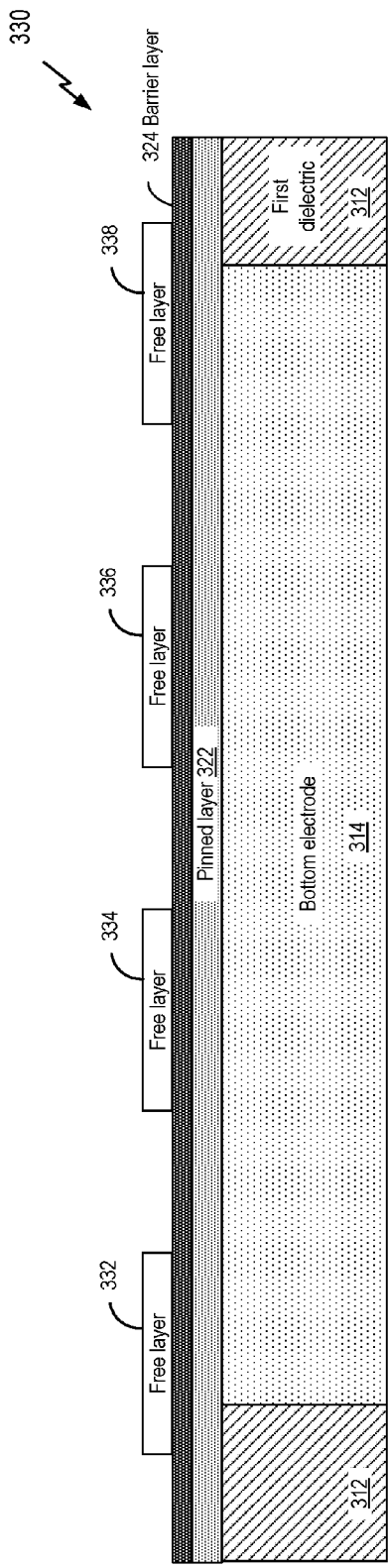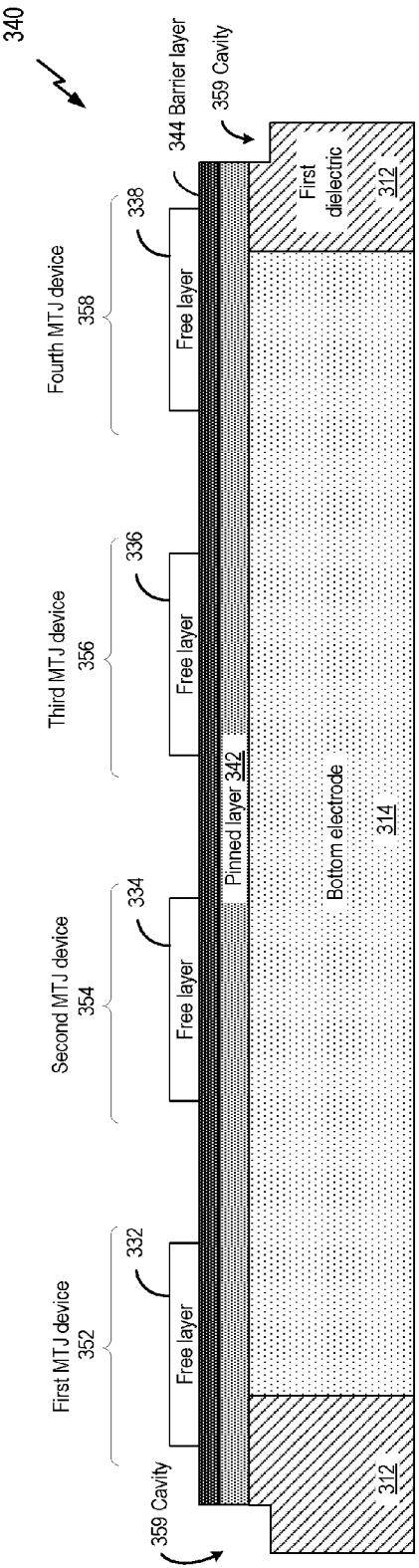

MAGNETIC TUNNEL JUNCTION (MTJ) DEVICE ARRAY

I. CROSS-REFERENCE TO RELATED APPLICATIONS

The present application is a divisional application of and claims priority from commonly owned U.S. patent application Ser. No. 14/609,169, filed Jan. 29, 2015, entitled "MAGNETIC TUNNEL JUNCTION (MTJ) DEVICE ARRAY," the contents of which are expressly incorporated herein by reference in their entirety

II. FIELD

The present disclosure is generally related to a magnetic tunnel junction (MTJ) device array.

III. DESCRIPTION OF RELATED ART

An array of magnetic tunnel junction (MTJ) devices includes MTJ devices based on a magnetic thin film stack. To form the devices, multiple layers are deposited onto a substrate and an etch process is performed to pattern at least one part of the MTJ thin film into distinct elements (i.e., laterally isolated structures). Most commonly, the stack is patterned into cylindrical shapes referred to as pillars. Element dimensions, such as pillar diameter and pillar to pillar pitch, are typically in the sub 500 nanometer (nm) range. Therefore the patterning process to obtain pillars, which is commonly based on reactive ion etching, ion beam etching, or a combination of both, faces several challenges. The patterning process may result in damage to a periphery (an edge) of one or more of the stacks. For example, the etch process may damage a dielectric barrier of a particular stack and/or may result in an electrical short between two magnetic layers of the particular stack, which may reduce a yield of operable (e.g., working) MTJ devices of the MTJ device array. In some implementations, the damage to the magnetic materials can be due to chemical reactions or due to ion irradiation during patterning. For example, shorts can occur when removed thin film material is re-deposited on the already patterned part of the devices.

IV. SUMMARY

The present disclosure describes a semiconductor device that includes a magnetic tunnel junction (MTJ), such as MTJ devices included in an array of MTJ devices. The array of MTJ devices may include two or more MTJ devices that each include a patterned structure (e.g., an MTJ pillar). The patterned MTJ stack may include a free layer, a barrier layer, and a pinned layer. Each of the MTJ devices included in the array of MTJ devices may have at least one common layer, such as a barrier layer or a pinned layer. Additionally, each of the MTJ devices included in the array of MTJ devices may have a corresponding free layer that is laterally isolated from the free layers of the other MTJ devices included in the array of MTJ devices. In some implementations, each of the MTJ devices included in the array of MTJ devices may be coupled to a common electrode, such as a top electrode.

To form the array of MTJ devices, multiple etching steps may be performed. For example, a first etch may be performed to form the free layer of each MTJ device. A second etch may be performed to form at least one layer (e.g., the barrier layer and/or the pinned layer) that is common to each MTJ of the array of MTJ devices. The first etch may be distinct from the second etch. By performing separate etches to form the free layers and the at least one layer (e.g., the barrier layer and/or the pinned layer), damage, such as barrier layer damage and/or electrical shorts between a free layer and a pinned layer, associated with performing a single etch to form individual MTJ stacks (e.g., laterally isolated MTJ stacks) may be reduced or eliminated.

In a particular aspect, a semiconductor device includes a first magnetic tunnel junction (MTJ) device including a barrier layer. The semiconductor device further includes a second MTJ device including the barrier layer. The semiconductor device also includes a top electrode coupled to the first MTJ device and the second MTJ device.

In another particular aspect, a method includes performing a first etch and performing a second etch. The first etch forms a first magnetic layer of a first MTJ device and forms a second magnetic layer of a second MTJ device. The second etch forms at least one layer of the first MTJ device and the second MTJ device. The first etch is distinct from the second etch.

In another particular aspect, a computer-readable storage device stores instructions that, when executed by a processor, cause the processor to perform operations including initiating a first patterning step and initiating a second patterning step. The first patterning step forms a first magnetic layer of a first MTJ device and forms a second magnetic layer of a second MTJ device formation. The second patterning step forms at least one layer of the first MTJ and the second MTJ. The patterning step is distinct from the second patterning step.

In another particular aspect, a method includes receiving a data file including design information corresponding to a semiconductor device. The method also includes fabricating the semiconductor device according to the design information. The semiconductor device includes an array of magnetic tunnel junction (MTJ) devices. The array of MTJ devices includes two or more MTJ devices coupled to a common top electrode. The array of MTJ devices includes a barrier layer that is common to each of the two or more MTJ devices.

One particular advantage provided by at least one of the disclosed embodiments is a semiconductor device that includes an array of MTJ devices having at least one common layer (e.g., a barrier layer and/or a pinned layer). By having the at least one common layer that is shared by multiple MTJ devices of the array, damage typically caused by forming distinct (e.g., laterally isolated) MTJ devices can be reduced or eliminated. For example, by having the at least one common layer, a single etch is not performed to define distinct (e.g., laterally isolated) MTJ devices for each MTJ device of the array of MTJ devices. Accordingly, because a single etch is not performed, damage (e.g., barrier layer damage and/or electrical shorts between a free layer and a pinned layer) associated with the single etch is reduced or eliminated. Additionally, because damage resulting from forming distinct MTJ devices is reduced or eliminated, a yield of operable (e.g., working) MTJ devices of the MTJ array may be increased.

Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

FIG. 1 is a block diagram of a particular illustrative embodiment of a semiconductor device that includes a magnetic tunnel junction (MTJ) device array;

FIGS. 2A, 2B, 2C, 2D, and 2E are diagrams of an illustrative example of a process of fabricating the semiconductor device of FIG. 1;

FIGS. 3A, 3B, 3C, 3D, and 3E are diagrams of an illustrative example of a process of fabricating a semiconductor device including an MTJ device array;

VI. DETAILED DESCRIPTION

Particular embodiments of the present disclosure are described below with reference to the drawings. In the description, common features are designated by common reference numbers.

Figure 1:
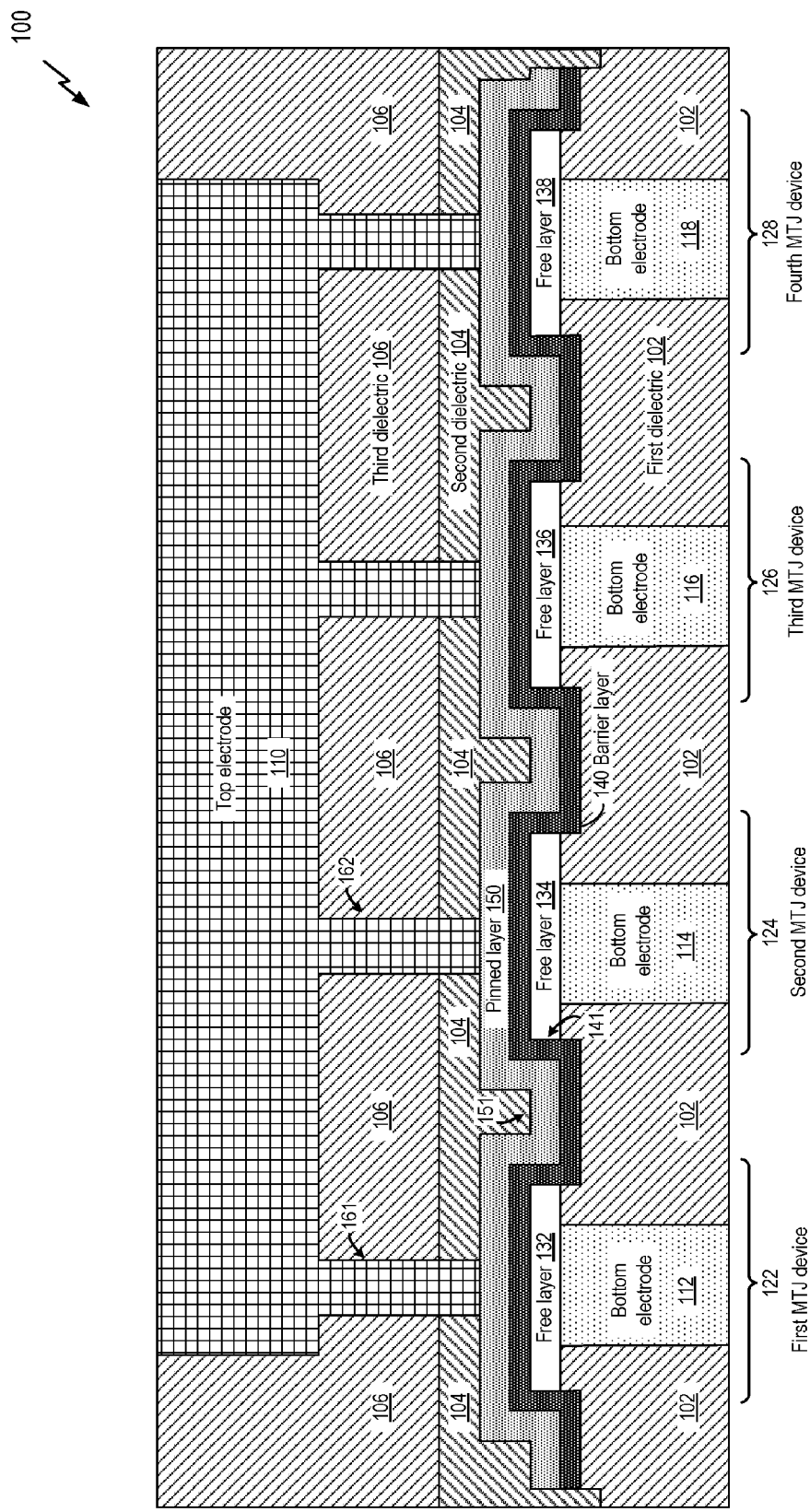

Referring to FIG. 1, a particular illustrative embodiment of a semiconductor device 100 that includes a magnetic tunnel junction (MTJ) device array is shown. The semiconductor device 100 may include a first dielectric layer 102, a second dielectric layer 104, and a third dielectric layer 106. The second dielectric layer 104 may be positioned between the first dielectric layer 102 and the third dielectric layer 106. Each dielectric layer 102-106 may include a corresponding dielectric material, such as a low-k dielectric material. For example, the first dielectric layer 102 may include a first dielectric material and the second dielectric layer 104 may include a second dielectric material, such as SiOCN. Although the first dielectric layer 102 and the third dielectric layer 106 are illustrated as including the same material (e.g., the same dielectric material), in other implementations, the first dielectric material of the first dielectric layer 102 may be different than a third dielectric material of the third dielectric layer 106. For example, one or more of the first dielectric material, the second dielectric material, and the third dielectric material may be a low k dielectric material. In some implementations, the second dielectric layer 104 may be or may include a capping layer, such as a capping layer that includes ruthenium (Ru).

The semiconductor device 100 includes an array of MTJ devices (e.g., multiple MTJ structures), such as an array of two or more MTJ devices. For example, the array of MTJ devices may include a first MTJ device 122, a second MTJ device 124, a third MTJ device 126, and a fourth MTJ device 128. Although the array of MTJ devices of the semiconductor device 100 is illustrated as having four MTJ devices, in other implementations, the array of MTJ devices may include fewer than four MTJ devices or more than four MTJ devices.

Each MTJ device of the array is associated with a MTJ pillar that includes a free layer, a barrier layer (e.g., a dielectric barrier layer), and a pinned layer. For example, each MTJ device of the array of MTJ devices may include a corresponding free layer that is distinct (e.g., laterally isolated) from free layers of other MTJ devices of the array of MTJ devices. To illustrate, the first MTJ device 122 may include a first free layer 132, the second MTJ device 124 may include a second free layer 134, the third MTJ device 126 may include a third free layer 136, and the fourth MTJ device 128 may include a fourth free layer 138. Each of the free layers 132-138 may include CoFeB or another magnetic material, as illustrative, non-limiting examples.

The array of MTJ devices includes a barrier layer 140 (e.g., a dielectric barrier layer) that is common to multiple MTJ devices of the array of MTJ devices. For example, the barrier layer 140 may be common to the first MTJ device 122, the second MTJ device 124, the third MTJ device 126, and the fourth MTJ device 128. Portions of the barrier layer 140 may be positioned between free layers of two adjacent MTJ devices. To illustrate, a portion 141 of the barrier layer 140 may be positioned between the free layer 132 of the first device 122 and the free layer 134 of the second device 124. The barrier layer 140 may include one or more materials, such as silicon nitride (SiN), silicon carbide (SiC), aluminum oxide (AlOx), magnesium oxide (MgO), or a combination thereof, as illustrative, non-limiting examples. Although the barrier layer 140 is illustrated as being common to all MTJ devices of the array of MTJ devices, in other implementations, the barrier layer 140 may be common to less than all of the MTJ devices of the array of MTJ devices.

The array of MTJ devices includes a pinned layer 150 that is common to multiple MTJ devices of the array of MTJ devices. For example, the pinned layer 150 may be common to the first MTJ device 122, the second MTJ device 124, the third MTJ device 126, and the fourth MTJ device 128. Portions of the pinned layer 150 may be positioned between free layers of two adjacent MTJ devices. To illustrate, a portion 151 of the pinned layer 150 may be positioned between the free layer 132 of the first device 122 and the free layer 134 of the second device 124. The pinned layer 150 may include CoFe, CoFeB, or other magnetic materials, as illustrative, non-limiting examples. Although the pinned layer 150 is illustrated as being common to all MTJ devices of the array of MTJ devices, in other implementations, the pinned layer 150 may be common to less than all of the MTJ devices of the array of MTJ devices. Although the pinned layer 150 is illustrated as being common to multiple MTJ devices of the array of MTJ devices, in some implementations, at least one MTJ device of the array of MTJ devices may have a corresponding pinned layer that is distinct (e.g., laterally isolated) from pinned layers of other MTJ devices of the array of MTJ devices.

The semiconductor device 100 may include multiple electrodes (e.g., multiple bottom electrodes) that are coupled to the array of MTJ devices. For example, the multiple bottom electrodes may include a first bottom electrode 112, a second bottom electrode 114, a third bottom electrode 116, and a fourth bottom electrode 118. The multiple bottom electrodes 112-118 may be positioned below the array of MTJ devices and each electrode may correspond to a different MTJ device. For example, the first bottom electrode 112 may correspond to the first MTJ device 122, the second bottom electrode 114 may correspond to the second MTJ device 124, the third bottom electrode 116 may correspond to the third MTJ device 126, and the fourth bottom electrode 118 may correspond to the fourth MTJ device 128. The bottom electrodes 112-118 may include tantalum (Ta), tantalum nitride (TaN), titanium (Ti), titanium nitride (TiN), copper (Cu), another conductive material, or a combination thereof, as illustrative, non-limiting examples. Although each bottom electrode is illustrated as being in contact with a corresponding free layer of an MTJ pillar, in other implementations, a particular bottom electrode may be coupled to a corresponding MTJ pillar (e.g., a corresponding free layer) by one or more structures, such as one or more vias or metal lines, as illustrative, non-limiting examples.

The semiconductor device 100 may include a common electrode, such as a top electrode 110. The top electrode 110 may be positioned above the array of MTJ devices (e.g., above the pinned layer 150). For example, the pinned layer 150 may be positioned between the barrier layer 140 and the top electrode 110. The top electrode 110 may include tantalum (Ta), tantalum nitride (TaN), titanium (Ti), titanium nitride (TiN), copper (Cu), another conductive material, or a combination thereof, as illustrative, non-limiting examples. In some implementations, the top electrode 110 may include a conductive structure (e.g., a metal structure) that is coupled to the pinned layer 150 by one or more vias. For example, each via of the one or more vias may be positioned at least partially in the second dielectric layer 104 and/or the third dielectric layer 106. Each via may couple the metal structure (of the top electrode 110) to a different MTJ device of the array of MTJ devices. To illustrate, a first via 161 may couple the metal structure (of the top electrode 110) to the first MTJ device 122 and a second via 162 may couple the metal structure (of the top electrode 110) to the second MTJ device 124.

The top electrode 110 may be coupled to a block select line (not shown) that may be used to select the array of MTJ devices (e.g., the array of MTJ devices may be block selectable). Each MTJ device may be coupled to a corresponding transistor (of a set of transistors) by the bottom electrodes 112-118. For example, the first MTJ device 122 may be coupled to a first transistor, the second MTJ device 124 may be coupled to a second transistor, the third MTJ device 126 may be coupled to a third transistor, and the fourth MTJ device 128 may be coupled to a fourth transistor. Each transistor coupled to the array of MTJ devices may have a corresponding gate that is coupled to a wordline. For example, each of a first gate of the first transistor, a second gate of the second transistor, a third gate of the third transistor, and a fourth gate of the fourth transistor may be coupled to the same wordline.

A first terminal of each transistor of the set of transistors may be coupled to a corresponding MTJ device and a second terminal of each transistor of the set of transistors may be coupled to a corresponding bit line. For example, a first terminal of the first transistor may be coupled to the first MTJ device 122 and a second terminal of the first transistor may be coupled to a first bit line. As another example, a first terminal of the second transistor may be coupled to the second MTJ device 124 and a second terminal of the second transistor may be coupled to a second bit line. Although not illustrated, the transistors (e.g., the first transistor, the second transistor, the third transistor, and the fourth transistor) may be included in the semiconductor device 100. For example, the transistors may be positioned below the first dielectric layer 102.

During operation of the semiconductor device 100, data values may be written to and read from the array of MTJ devices that includes the MTJ devices 122-128. For example, a first set of data values may be stored at the MTJ devices 122-128. A data value of a particular MTJ device may correspond to an orientation of a magnetic moment of a free layer of the particular MTJ device relative to a magnetic moment of a pinned layer of the particular MTJ device.

In some implementations, a capping layer (not shown) may be positioned above the pinned layer 150. For example, the pinned layer 150 may be positioned between the capping layer and the barrier layer 140. In some implementations, the capping layer may be in contact with the pinned layer. A via may extend through the capping layer and may be in contact with the pinned layer 150. The via may also be coupled to the top electrode 110. To illustrate, a first via may be coupled to a portion of the pinned layer 150 that corresponds to the first MTJ device 122 and a second via may be coupled to a portion of the pinned layer 150 that corresponds to the second MTJ device 124. The first via and the second via may each be coupled to the top electrode 110.

Although the semiconductor device 100 is illustrated as including a single array of MTJ devices, in other implementations, the semiconductor device 100 may include multiple arrays of MTJ devices. For example, the semiconductor device 100 may include two or more arrays of MTJ devices, such as a first MTJ device array and a second MTJ device array. The first MTJ device array may be distinct (e.g., laterally isolated) from the second MTJ device array. In some implementations, a first top electrode of the first MTJ device array and a second top electrode of the second MTJ device array may be coupled to the same select line. In other implementations, each of the first top electrode and the second top electrode may be coupled to different select lines.

Each array of the multiple arrays of MTJ devices may be coupled to a corresponding set of transistors, as described above with reference to the array of MTJ devices that includes the MTJ devices 122-128. For example, the first MTJ device array may be coupled to a first set of transistors and the second MTJ device array may be coupled to a second set of transistors. In some implementations, each gate of the first set of transistors and each gate of the second set of transistors may be coupled to the same wordline. In other implementations, each gate of the first set of transistors may be coupled to a first wordline and each gate of the second set of transistors may be coupled to a second wordline that is distinct from the first wordline. Additionally, the first set of transistors may be coupled to a first set of bit lines and the second set of transistors may be coupled to a second set of bit lines. In some implementations, the first set of bit lines may be different than the second set of bit lines. In other implementations, the first set of bit lines is the same as the second set of bit lines. To illustrate, a first transistor of the first set of transistors and a first transistor of the second set of transistors may be coupled to a first bit line (e.g., the same first bit line), and a second transistor of the second set of transistors and a second transistor of the second set of transistors may be coupled to a second bit line (e.g., the same second bit line).

By having the at least one common layer that is shared by multiple MTJ devices of the array of MTJ devices, damage typically caused by forming distinct (e.g., laterally isolated) MTJ pillars can be reduced or eliminated. For example, by having the barrier layer 140 that is common to the array of MTJ devices (e.g., the MTJ devices 122-128), portions of the barrier layer 140 positioned between the free layers 132-138 and the pinned layer 150 may not have damage (e.g., etch damage) that is typically caused by forming distinct barrier layers for each MTJ device of the MTJ device array. Additionally, by having the barrier layer 140 that is common to the array of MTJ devices, electrical shorts (between a free layer and a pinned layer of an MTJ device) that may result from forming individual MTJ pillars may be eliminated. Accordingly, because damage resulting from forming distinct MTJ pillars is reduced or eliminated, a yield of operable (e.g., working) MTJ devices of the MTJ device array may be increased.

FIGS. 2A-2E illustrate examples of stages of a first fabrication process that may be used to fabricate a semiconductor device including an MTJ device array. The semiconductor device may include or correspond to the semiconductor device 100 of FIG. 1. The MTJ device array may include multiple MTJ devices, such as the MTJ devices 122-128 of FIG. 1.

Figures 2A, 2B:
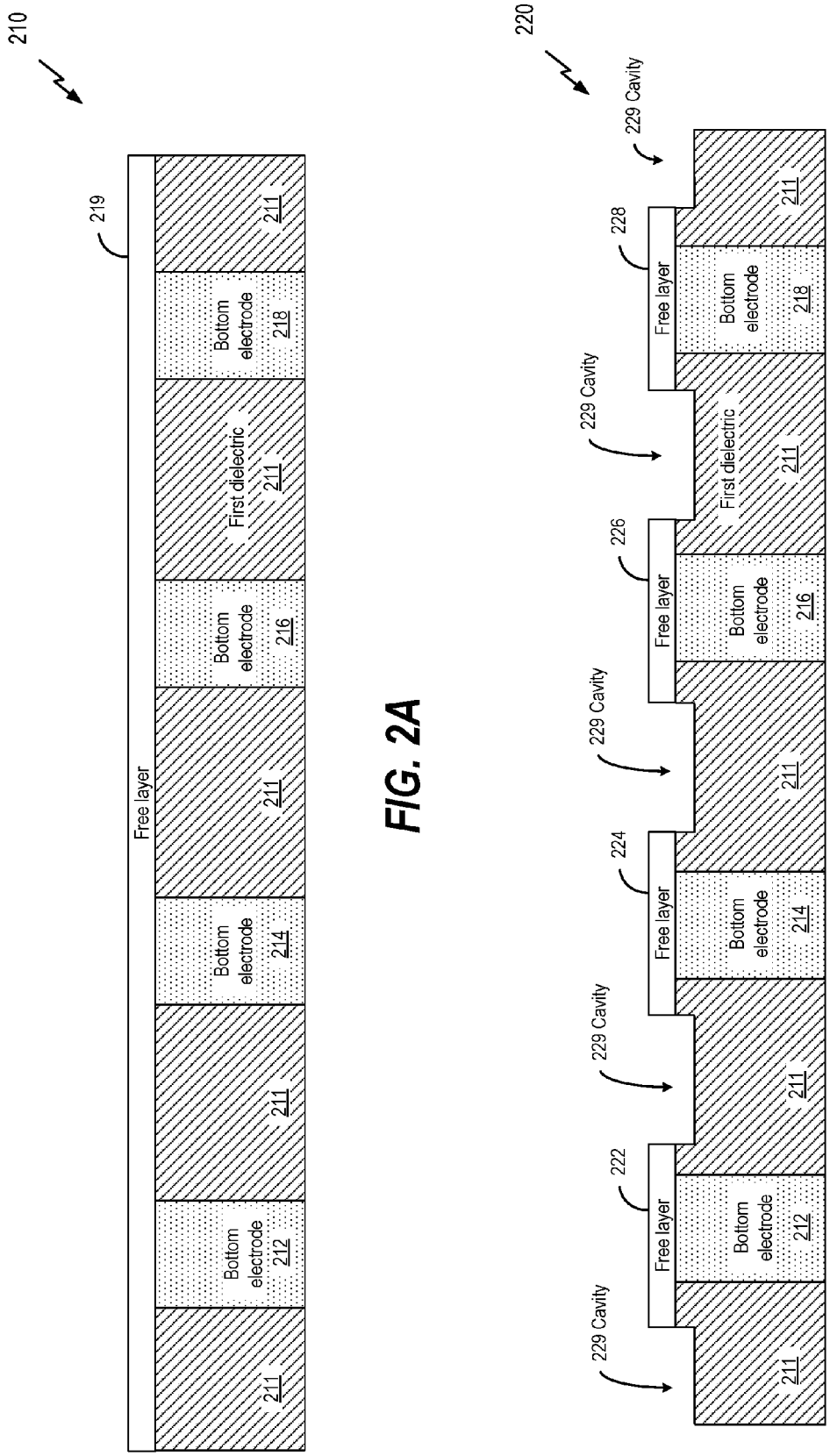

Referring to FIG. 2A, a first stage of the first fabrication process is depicted and generally designated 210. FIG. 2A shows a first dielectric layer 211, bottom electrodes 212-218, and a free layer 219. The first dielectric layer 211 may include or correspond to the first dielectric layer 102 of FIG. 1. The bottom electrodes 212-218 may include a first bottom electrode 212, a second bottom electrode 214, a third bottom electrode 216, and a fourth bottom electrode 218. The bottom electrodes 212-218 may have been formed in the first dielectric layer 211 by creating (e.g., etching) one or more cavities in the first dielectric layer 211 and depositing a conductive material in each of the cavities to form the bottom electrodes 212-218. In some implementations, after the conductive material is deposited, a planarization may have been performed to define each of the bottom electrodes 212-218. Although the bottom electrodes 212-218 are depicted as including four bottom electrodes, in other implementations, the bottom electrodes 212-218 may include fewer than four electrodes or more than four electrodes. The bottom electrodes 212-218 may include or correspond to the bottom electrodes 112-118 of FIG. 1. The bottom electrodes 212-218 may include tantalum (Ta), tantalum nitride (TaN), titanium (Ti), titanium nitride (TiN), copper (Cu), another conductive material, or a combination thereof, as illustrative, non-limiting examples.

The free layer 219 may be formed by depositing a first magnetic material on the first dielectric layer 211 and the bottom electrodes 212-218. For example, the free layer 219 may be deposited using physical vapor deposition (PVD), atomic layer deposition (ALD), chemical vapor deposition (CVD), sputter deposition, or spray deposition, as illustrative, non-limiting examples. The free layer 219 may include CoFeB or another magnetic material, as illustrative, non-limiting examples.

Referring to FIG. 2B, a second stage of the first fabrication process is depicted and generally designated 220. In FIG. 2B, free layers 222-228 are formed above the first dielectric layer 211 and the bottom electrodes 212-218. The free layers 222-228 may include a first free layer 222, a second free layer 224, a third free layer 226, and a fourth free layer 228. The first free layer 222, the second free layer 224, the third free layer 226, and the fourth free layer 228 may include or correspond to the first free layer 132, the second free layer 134, the third free layer 136, and the fourth free layer 138 of FIG. 1, respectively. The free layers 222-228 may be formed by etching the free layer 219 of FIG. 2A to define the free layers 222-228. Etching the free layer 219 of FIG. 2A removes portions of the first dielectric layer 211 and forms one or more cavities 229. Each of the free layers 222-228 may correspond to a different MTJ pillar (e.g., a different MTJ device), as described further herein.

Figure 2C:
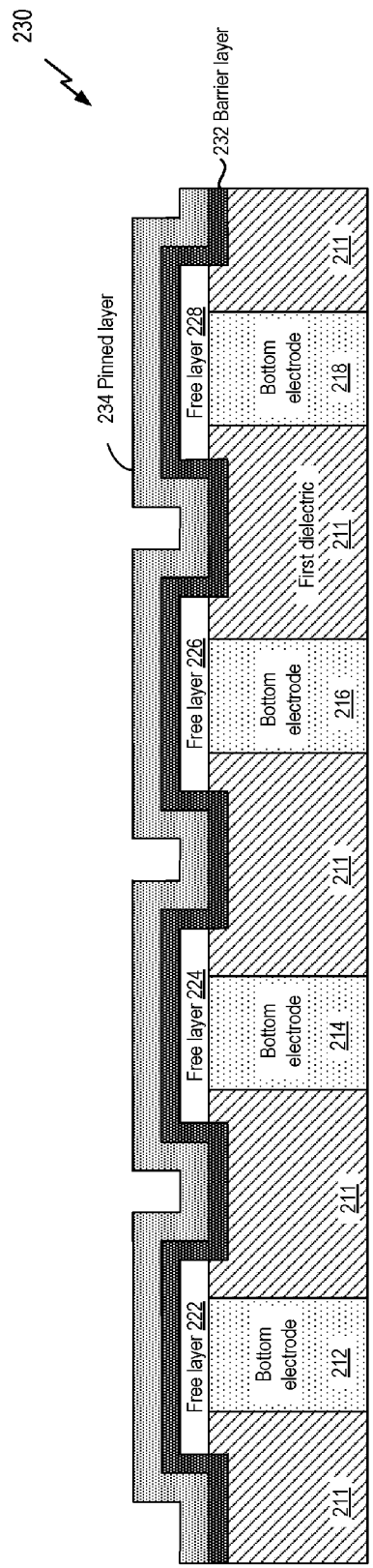

Referring to FIG. 2C, a third stage of the first fabrication process is depicted and generally designated 230. FIG. 2C shows the semiconductor device after formation of a barrier layer 232 and a pinned layer 234. The barrier layer 232 may be formed by depositing a barrier layer material above the free layers 222-228 and/or above the first dielectric layer 211. For example, the barrier layer material may be deposited on one or more exposed surfaces of the free layers 222-228 and/or one or more exposed surfaces of the first dielectric layer 211. The barrier layer 232 may be deposited using physical vapor deposition (PVD), atomic layer deposition (ALD), chemical vapor deposition (CVD), sputter deposition, or spray deposition, as illustrative, non-limiting examples. The barrier layer 232 may include one or more materials, such as silicon nitride (SiN), silicon carbide (SiC), aluminum oxide (AlOx), magnesium oxide (MgO), or a combination thereof, as illustrative, non-limiting examples.

The pinned layer 234 may be formed by depositing a pinned layer material (e.g., a magnetic material) above the barrier layer material. For example, the pinned layer material may be deposited on the barrier layer 232. The pinned layer 234 may be deposited using physical vapor deposition (PVD), atomic layer deposition (ALD), chemical vapor deposition (CVD), sputter deposition, or spray deposition, as illustrative, non-limiting examples. The pinned layer 234 may include CoFe, CoFeB, or other magnetic materials, as illustrative, non-limiting examples.

Prior to depositing the barrier layer material and the pinned layer material, a pre-clean may be performed on the free layers 222-228. In some implementations, performing the pre-clean, depositing the barrier layer material (e.g., forming the barrier layer 232), depositing the pinned layer material (e.g., forming the pinned layer 234), or a combination thereof, may be performed in-situ.

Figure 2D:
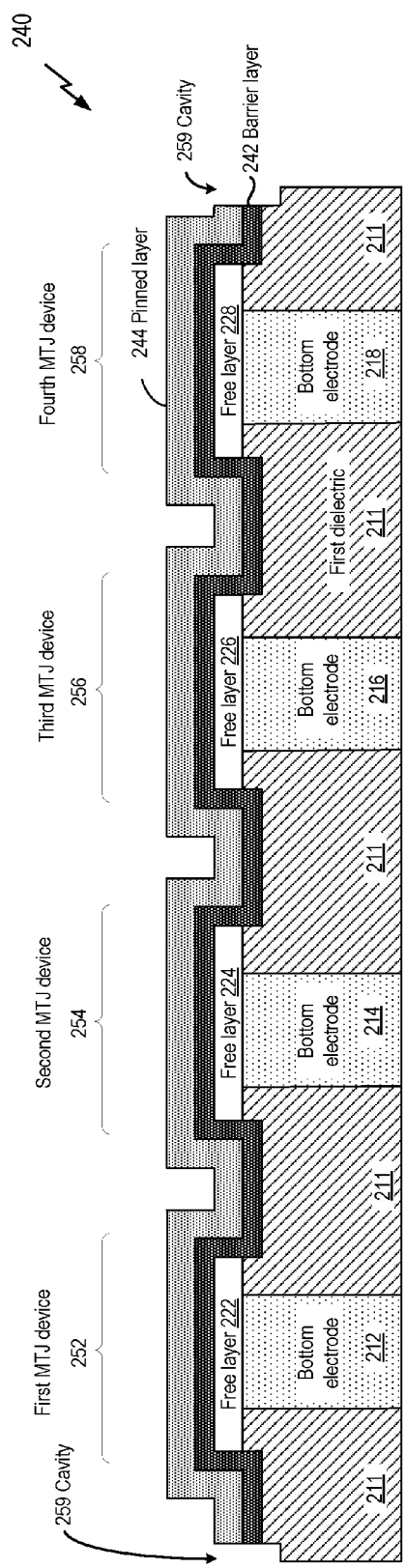

Referring to FIG. 2D, a fourth stage of the first fabrication process is depicted and generally designated 240. FIG. 2D shows the semiconductor device after one or more cavities 259 are formed. The one or more cavities 259 may be formed by etching the barrier layer 232 and the pinned layer 234 of FIG. 2C. For example, the barrier layer 232 and the pinned layer 234 of FIG. 2C may be etched to form (e.g., establish) the barrier layer 242, the pinned layer 244, and the one or more cavities 259 of FIG. 2D. In some implementations, the pinned layer 234 and the barrier layer 232 of FIG. 2C may be etched during a single etch process. Etching the pinned layer 234 and the barrier layer 232 of FIG. 2C may not effect portions of the barrier layer 232 that are in contact with edges (e.g., surfaces) of the free layers 222-228. Additionally, etching the pinned layer 234 and the barrier layer 232 of FIG. 2C may remove portions of the first dielectric layer 211 and form the one or more cavities 259.

Etching the pinned layer 234 and the barrier layer 232 of FIG. 2C may establish the pinned layer 244 and the barrier layer 242 of an MTJ device array. The MTJ device array may include multiple MTJ devices, such as a first MTJ device 252, a second MTJ device 254, a third MTJ device 256, and a fourth MTJ device 258. Each of the MTJ devices 252-258 may be associated with a corresponding bottom electrode. For example, the first MTJ device 252 may correspond to the first bottom electrode 212, the second MTJ device 254 may correspond to the second bottom electrode 214, the third MTJ device 256 may correspond to the third bottom electrode 216, and the fourth MTJ device 258 may correspond to the fourth bottom electrode 218. The first MTJ device 252, the second MTJ device 254, the third MTJ device 256, and the fourth MTJ device 258 may include or correspond to the first MTJ device 122, the second MTJ device 124, the third MTJ device 126, and the fourth MTJ device 128 of FIG. 1, respectively. Although the MTJ device array is illustrated as having four MTJ devices, in other implementations, the MTJ device array may include fewer than four MTJ devices or more than four MTJ devices.

Figure 2E:
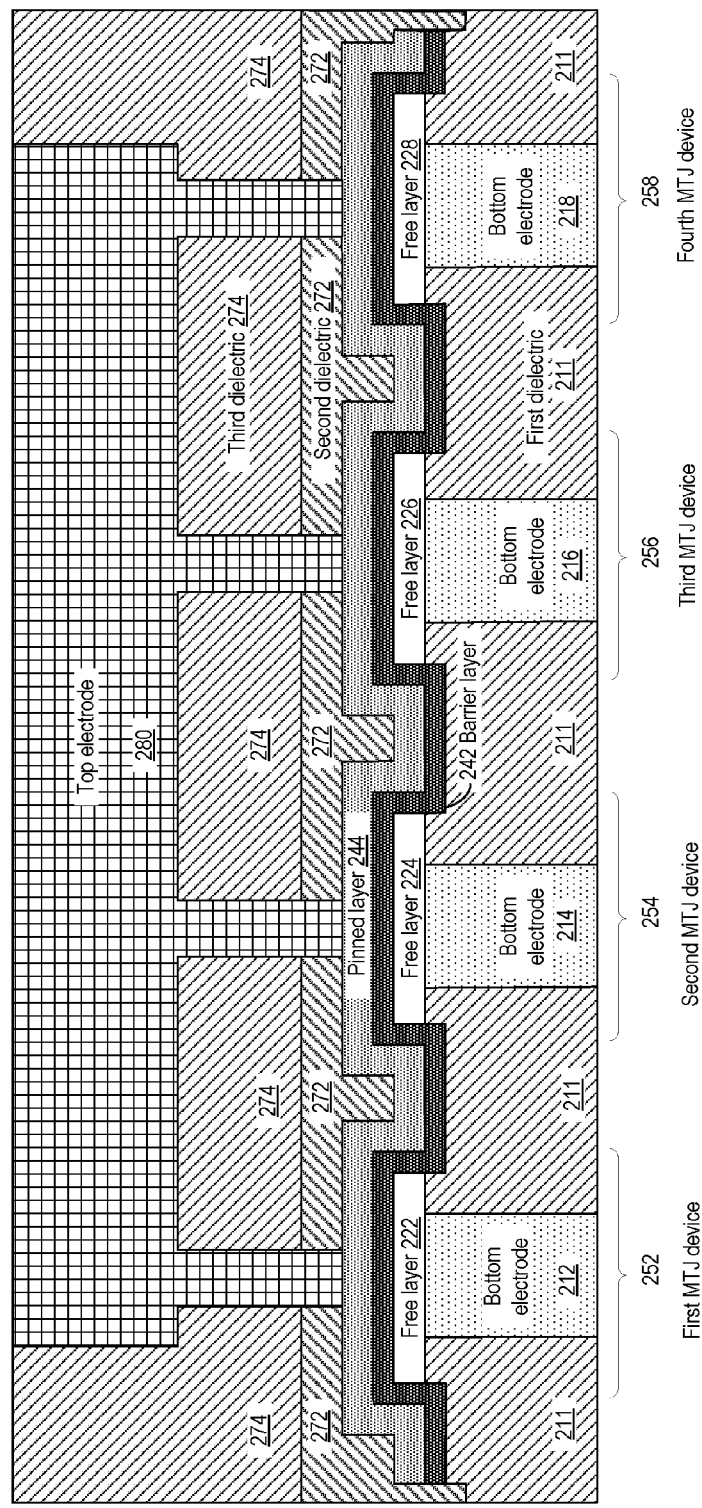

Referring to FIG. 2E, a fifth stage of the first fabrication process is depicted and generally designated 260. FIG. 2E shows the semiconductor device after formation of a top electrode 280. The top electrode 280 may include or correspond to the top electrode 210 of FIG. 1. Although described as an "electrode", the top electrode 280 may include or correspond to a metal line, one or more vias, or a combination thereof. The top electrode 280 may include tantalum (Ta), tantalum nitride (TaN), titanium (Ti), titanium nitride (TiN), copper (Cu), another conductive material, or a combination thereof, as illustrative, non-limiting examples. The top electrode 280 may be formed after formation of a second dielectric layer 272 and/or after formation of a third dielectric layer 274. The second dielectric layer 272 may be formed by depositing a corresponding dielectric material above the pinned layer 244. For example, the dielectric material of the second dielectric layer may include SiOCN, as an illustrative, non-limiting example. In some implementations, the second dielectric layer 272 may include or may be a capping layer. The capping layer may be formed by depositing a capping material, such as ruthenium (Ru). The third dielectric layer 274 may be formed by depositing a corresponding dielectric material above the second dielectric layer 272. The dielectric material of the third dielectric layer 274 may be the same as, or may be different than, the dielectric material of the second dielectric layer 272. To form the top electrode 280, the second dielectric layer 272 and the third dielectric layer 274 may be etched to create one or more cavities that expose one or more portions of the pinned layer 244, and one or more conductive materials (e.g., copper (Cu)) may be deposited in the one or more cavities.

By etching the free layer 219 of FIG. 2A (e.g., to establish the free layers 222-228 of FIG. 2B) separate from etching the pinned layer 234 and the barrier layer 232 of FIG. 2C (to establish the pinned layer 244 and the barrier layer 242 of FIG. 2D), an MTJ device array that includes at least one common layer may be formed. The at least one common layer may include the pinned layer 244 and/or the barrier layer 242. By having the at least one common layer of the MTJ device array, individual (e.g., laterally isolated) MTJ pillars are not formed and damage resulting from the formation of individual MTJ pillars is eliminated.

FIGS. 3A-3E illustrate examples of stages of a second fabrication process that may be used to fabricate a semiconductor device including an MTJ device array. The MTJ device array may include multiple MTJ devices, as described further herein with reference to FIGS. 3D-3E.

Referring to FIG. 3A, a first stage of the second fabrication process is depicted and generally designated 310. FIG. 3A shows a first dielectric layer 312 and a bottom electrode 314. The first dielectric layer 312 may include a first dielectric material, such as a low-k dielectric material. The bottom electrode 314 may include a conductive material, such as tantalum (Ta), tantalum nitride (TaN), titanium (Ti), titanium nitride (TiN), copper (Cu), another conductive material, or a combination thereof, as illustrative, non-limiting examples. Although descried as an "electrode", the bottom electrode 314 may alternatively be a metal line or other conductive structure. Forming the bottom electrode 314 may include etching the first dielectric layer 312 to form a cavity defined by the first dielectric layer 312 and one or more other layers (not shown) that are positioned below the first dielectric layer 312. After the cavity is formed, a conductive material may be deposited in the cavity to form the bottom electrode 314. For example, the conductive material may be deposited using physical vapor deposition (PVD), atomic layer deposition (ALD), chemical vapor deposition (CVD), sputter deposition, or spray deposition, as illustrative, non-limiting examples. A planarization may be performed on the conductive material to form a surface of the bottom electrode 314 and/or a surface of the first dielectric layer 312. In some implementations, the bottom electrode 314 may be coupled to a select line (not shown).

Referring to FIG. 3B, a second stage of the second fabrication process is depicted and generally designated 320. In FIG. 3B, a pinned layer 322, a barrier layer 324, and a free layer 326 are formed above the first dielectric layer 312 and the bottom electrode 314. The pinned layer 322 may be formed by depositing a first magnetic material above the bottom electrode 314 and/or above the first dielectric layer 312. The first magnetic material may be deposited using physical vapor deposition (PVD), atomic layer deposition (ALD), chemical vapor deposition (CVD), sputter deposition, or spray deposition, as illustrative, non-limiting examples. In some implementations, the first magnetic material may be deposed on a planarized surface of the bottom electrode 314 and/or the first dielectric layer 312. The first magnetic material may include CoFe, CoFeB, or other magnetic materials, as illustrative, non-limiting examples.

The barrier layer 324 (e.g., a dielectric barrier layer) may be formed by depositing a barrier layer material above the pinned layer 322. The barrier layer material may be deposited using physical vapor deposition (PVD), atomic layer deposition (ALD), chemical vapor deposition (CVD), sputter deposition, or spray deposition, as illustrative, non-limiting examples. The barrier layer material may include one or more materials, such as silicon nitride (SiN), silicon carbide (SiC), aluminum oxide (AlOx), magnesium oxide (MgO), or a combination thereof, as illustrative, non-limiting examples.

The free layer 326 may be formed by depositing a second magnetic material above the barrier layer 324. The second magnetic material may be deposited using physical vapor deposition (PVD), atomic layer deposition (ALD), chemical vapor deposition (CVD), sputter deposition, or spray deposition, as illustrative, non-limiting examples. The second magnetic material may include CoFeB or another magnetic material, as illustrative, non-limiting examples. In some implementations, forming the pinned layer 322, the barrier layer 324, and the free layer 326 may include an in-situ deposition of a pinned layer material (e.g., a first magnetic material), the barrier layer material (e.g., a dielectric barrier material), and a free layer material (e.g., a second magnetic material).

Referring to FIG. 3C, a third stage of the second fabrication process is depicted and generally designated 330. In FIG. 3C, separate (e.g., laterally isolated) free layers 332-338 are formed above the barrier layer 324. The free layers 332-338 may include a first free layer 332, a second free layer 334, a third free layer 336, and a fourth free layer 338. The free layers 332-338 may be formed by etching the free layer 326 of FIG. 3B to define (e.g., to establish) the free layers 332-338. Each of the free layers 332-338 may correspond to a different MTJ device (e.g., a different MTJ pillar), as described further herein.

Referring to FIG. 3D, a fourth stage of the second fabrication process is depicted and generally designated 340. FIG. 3D shows the semiconductor device after the barrier layer 344 and the pinned layer 342 are formed (e.g., defined). The barrier layer 344 may be formed by etching the barrier layer 324 of FIG. 3C to define the barrier layer 344 of FIG. 3D. The pinned layer 342 may be formed by etching the pinned layer 322 of FIG. 3C to define the pinned layer 342 of FIG. 3D. In some implementations, the pinned layer 322 and the barrier layer 324 of FIG. 3C may be etched during a single etch process. Etching the pinned layer 322 and the barrier layer 324 of FIG. 3C may not effect portions of the barrier layer 324 that are positioned between the free layers 332-338 and the pinned layer 322. Additionally, etching the pinned layer 322 and the barrier layer 324 of FIG. 3C may remove portions of the first dielectric layer 312 and form cavities 359.

Etching the pinned layer 322 and the barrier layer 324 of FIG. 3C may define the pinned layer 342 and the barrier layer 344 of an MTJ device array. The MTJ device array may include multiple MTJ devices, such as a first MTJ device 352, a second MTJ device 354, a third MTJ device 356, and a fourth MTJ device 358. Each of the MTJ devices 352-358 may be coupled to the bottom electrode 314. The pinned layer 342 and the barrier layer 344 may be common to two or more MTJ devices of the MTJ device array. Although the MTJ device array is illustrated as having four MTJ devices, in other implementations, the MTJ device array may include fewer than four MTJ devices or more than four MTJ devices.

Figure 3E:
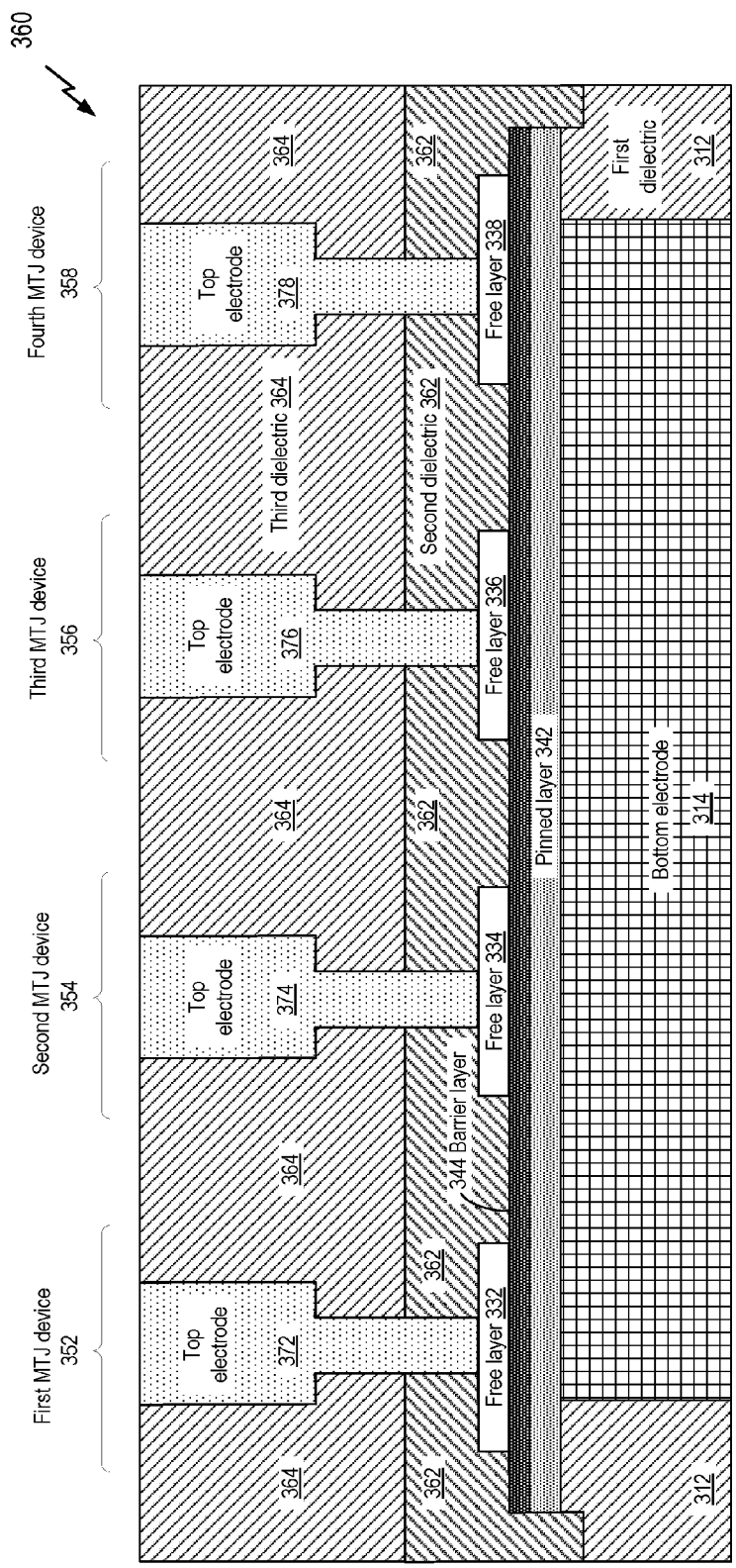

Referring to FIG. 3E, a fifth stage of the second fabrication process is depicted and generally designated 360. FIG. 3E shows the semiconductor device after formation of top electrodes 372-378. For example, the top electrodes 372-278 may include a first top electrode 372, a second top electrode 374, a third top electrode 376, and a fourth top electrode 378. Although described as an "electrode", each of the top electrodes 372-378 may include or correspond to a metal line, one or more vias, or a combination thereof. Each of the top electrodes 372 may be coupled to a corresponding MTJ device. For example, the first top electrode 372 may be coupled to the first MTJ device 352 (e.g., the first free layer 332), the second top electrode 374 may be coupled to the second MTJ device 354 (e.g., the second free layer 334), the third top electrode 376 may be coupled to the third MTJ device 356 (e.g., the third free layer 336), and the fourth top electrode 378 may be coupled to the fourth MTJ device 358 (e.g., the fourth free layer 338).

Formation of the top electrodes 372-378 may include depositing a second dielectric layer 362 and/or depositing a third dielectric layer 364. For example, a second dielectric material may be deposited above the free layers 332-338 and above the barrier layer 344. For example, the dielectric material of the second dielectric layer may include SiOCN, as an illustrative, non-limiting example. The second dielectric material may be deposited using physical vapor deposition (PVD), atomic layer deposition (ALD), chemical vapor deposition (CVD), sputter deposition, or spray deposition, as illustrative, non-limiting examples. In some implementations, the second dielectric layer 362 may include or may be a capping layer. The capping layer may include ruthenium (Ru), as an illustrative, non-limiting example. The third dielectric layer 364 may be formed by depositing a third dielectric material above the second dielectric layer 362. The third dielectric material may be deposited using PVD, ALD, CVD, sputter deposition, or spray deposition, as illustrative, non-limiting examples. The first dielectric material of the first dielectric layer 312, the second dielectric material of the second dielectric layer 362, and the third dielectric material of the third dielectric layer 364 may be the same material or may be different materials. For example, each of the first dielectric material, the second dielectric material, and the third dielectric material may be the same low-k dielectric material.

The second dielectric layer 362 and the third dielectric layer 364 may be etched to expose portions of the MTJ devices 352-358 (e.g., portions of the free layers 332-338). After exposing the portions of the MTJ devices 352-358, the top electrodes 372-378 may be formed by depositing one or more conductive materials. The one or more conductive materials may include tantalum (Ta), tantalum nitride (TaN), titanium (Ti), titanium nitride (TiN), copper (Cu), another conductive material, or a combination thereof, as illustrative, non-limiting examples.

By performing multiple etches after forming the pinned layer 322, the barrier layer 324, and the free layer 326, an interface quality between adjacent layers of the pinned layer 322, the barrier layer 324, and the free layer 326 may be maintained during and after formation (e.g., definition) of the pinned layer 342, the barrier layer 344, and the free layers 332-338. For example, etching the free layer 326 of FIG. 3B (e.g., to define the free layers 332-338 of FIG. 3C) does not damage a first interface quality between each of the free layers 332-338 and the barrier layer 324 of the MTJ devices 352-358. As another example, etching the pinned layer 322 and the barrier layer 324 of FIG. 3C (to define the pinned layer 342 and the barrier layer 344 of FIG. 3D) does not damage the first interface or a second interface between the pinned layer 342 and the barrier layer 324 of the MTJ devices 352-358.

Figure 4:
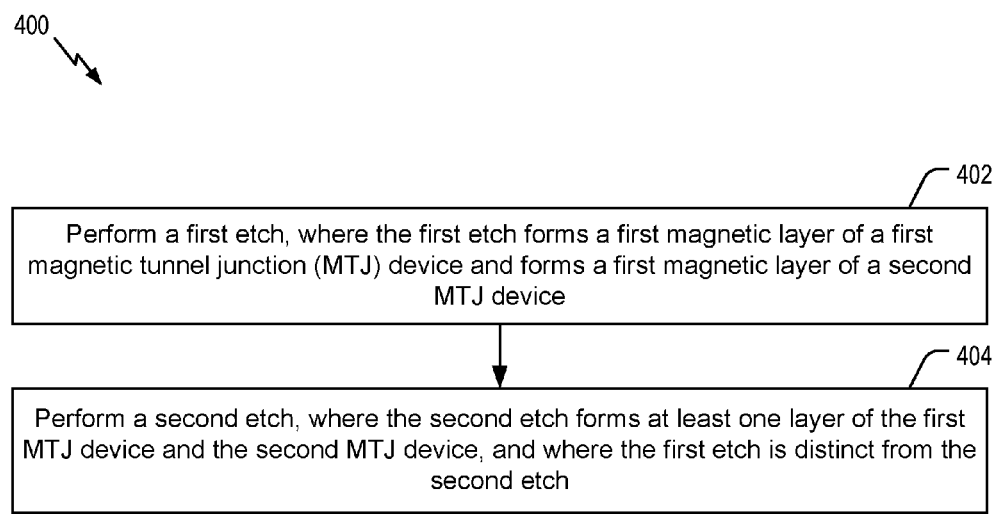
FIG. 4 is a flow chart of a particular illustrative embodiment of a method of forming a semiconductor device that includes an MTJ device array.

Referring to FIG. 4, a flow diagram of an illustrative embodiment of a method 400 of forming a semiconductor device is depicted and generally designated 400. The semiconductor device may include an array of magnetic tunnel junction (MTJ) devices. The array of MTJ devices may include two or more MTJ devices (e.g., two or more MTJ pillars), such as the MTJ devices 122-128 of FIG. 1, the MTJ devices 252-258 formed by the process of FIGS. 2A-2E, or the MTJ devices 352-358 formed by the process of FIGS. 3A-3E.

The method 400 may include performing a first etch, at 402. The first etch may pattern a first magnetic layer of a first magnetic tunnel junction (MTJ) device and may pattern a second magnetic layer of a second MTJ device. The first magnetic layer may include a first free layer and the second magnetic layer may include a second free layer. For example, the first MTJ device and the second MTJ device may include or correspond to the MTJ devices 122-128 of FIG. 1, the MTJ devices 252-258 formed by the process of FIGS. 2A-2E, or the MTJ devices 352-358 formed by the process of FIGS. 3A-3E. To illustrate, when the first MTJ device and second MTJ device correspond to the first MTJ device 122 and the second MTJ device 124 of FIG. 1, respectively, the first magnetic layer and the second magnetic layer may include or correspond to the first magnetic layer (e.g., the first free layer 132) and the second magnetic layer (e.g., the second free layer 134) of FIG. 1, respectively. As another illustrative example, when the first MTJ device and second MTJ device correspond to the first MTJ device 352 and the second MTJ device 354 of FIG. 3E, respectively, the first magnetic layer and the second magnetic layer may include or correspond to the first magnetic layer (e.g., the first free layer 332) and the second magnetic layer (e.g., the second free layer 334) of FIG. 3E, respectively.

The method 400 may further include performing a second etch, at 404. The second etch may define (e.g., establish) at least one layer of the first MTJ device and the second MTJ device, such as at least one layer of the first MTJ device and the second MTJ device that is common to the first MTJ device and the second MTJ device. The first etch may be distinct (e.g., separate) from the second etch. The at least one layer of the first MTJ device and the second MTJ device may include a barrier layer, a third magnetic layer (e.g., a pinned layer), or both. For example, the barrier layer may include or correspond to the barrier layer 140 of FIG. 1, the barrier layer 242 of FIGS. 2D-2E, or the barrier layer 344 of FIGS. 3D-3E. The pinned layer may include or correspond to the pinned layer 150 of FIG. 1, the pinned layer 244 of FIGS.

2D-2E, or the pinned layer 342 of FIGS. 3D-3E. Referring to FIGS. 2C-2D, the second etch may be performed on the pinned layer 234 and the barrier layer 232 of FIG. 2C to establish the pinned layer 244 and the barrier layer 242 of FIG. 2D, as an illustrative, non-limiting example. As another example, with reference to FIGS. 3C-3D, the second etch may be performed on the pinned layer 322 and the barrier layer 324 of FIG. 3C to establish the pinned layer 342 and the barrier layer 344 of FIG. 3D. When the at least one layer includes the barrier layer, a portion of the barrier layer, such as the portion 141 of the barrier layer 140 of FIG. 1, may be positioned between the first MTJ device and the second MTJ device. When the at least one layer includes the third magnetic layer (e.g., the pinned layer), a portion of the third magnetic layer, such as the portion 151 of the pinned layer 150 of FIG. 1, may be positioned between the first MTJ device and the second MTJ device.

In some implementations, an electrode may be formed that is common to the first MTJ device and the second MTJ device. For example, the electrode may be formed after the second etch is performed. To illustrate, the electrode may be a top electrode, such as the top electrode 110 of FIG. 1 or the top electrode 280 of FIG. 2E. As another example, the electrode may be formed prior to the first etch and the second etch and may be a bottom electrode, such as the bottom electrode 314 of FIGS. 3A-3E.

In some implementations, performing the first etch and performing the second etch are initiated at or controlled by a controller of a fabrication system. The first etch may be performed prior to depositing a barrier layer material and/or a pinned layer material. For example, referring to the process of FIGS. 2A-2E, a first etch of the free layer 219 of FIG. 2A to establish the free layers 222-228 of FIG. 2B is performed prior to formation of the pinned layer 234 and the barrier layer 232 of FIG. 2C. Alternatively, the first etch may be performed after depositing the barrier layer material and/or the pinned layer material. For example, referring to the process of FIGS. 3A-3E, a pinned layer 322 and the barrier layer 324 are formed at FIG. 3B prior to the free layer 326 of FIG. 3B being etched to form the free layers 332-338 of FIG. 3C.

In some implementations, the first etch may form a fourth magnetic layer (e.g., a free layer) of a third MTJ device. For example, the third MTJ device may include or correspond to the MTJ devices 122-128 of FIG. 1, the MTJ devices 252-258 formed by the process of FIGS. 2A-2E, or the MTJ devices 352-358 formed by the process of FIGS. 3A-3E. To illustrate, the third MTJ device may correspond to the third MTJ device 126 of FIG. 1, and the fourth magnetic layer may correspond to the free layer 136. As another illustrative example, the third MTJ device may correspond to the third MTJ device 356 of FIG. 3E and the fourth magnetic layer may correspond to the third free layer 336. The third MTJ device may include the fourth magnetic layer and the at least one layer. For example, the at least one layer may include the barrier layer and the third magnetic layer (e.g., the pinned layer). The third MTJ device may be coupled to an electrode that is common to the first MTJ device and the second MTJ device, such as the top electrode 110 of FIG. 1, the top electrode 280 of FIG. 2E, or the bottom electrode 314 of FIG. 3A.

The method 400 may be used to form a semiconductor device that includes an array of magnetic tunnel junction (MTJ) devices. The array of MTJ devices may include two or more MTJ devices coupled to a common electrode. The array of MTJ devices may further include a barrier layer and/or a pinned layer that is common to each of the two or more MTJ devices. By having one or more common layers that are shared by multiple MTJ devices of the array of MTJ devices, damage typically caused by forming distinct (e.g., laterally isolated) MTJ pillars can be reduced or eliminated. Accordingly, because damage resulting from forming distinct MTJ pillars is reduced or eliminated, a yield of operable (e.g., working) MTJ devices of the MTJ device array may be increased.

The process shown in FIGS. 2A-2E, the process shown in FIGS. 3A-3E, and/or the method 400 of FIG. 4 may be controlled by a processing unit such as a central processing unit (CPU), a controller, a field-programmable gate array (FPGA) device, an application-specific integrated circuit (ASIC), another hardware device, firmware device, or any combination thereof. As an example, the process shown in FIGS. 2A-2E, the process shown in FIGS. 3A-3E, and/or the method 400 of FIG. 4 can be performed by one or more processors that execute instructions to control fabrication equipment.

Figure 5:
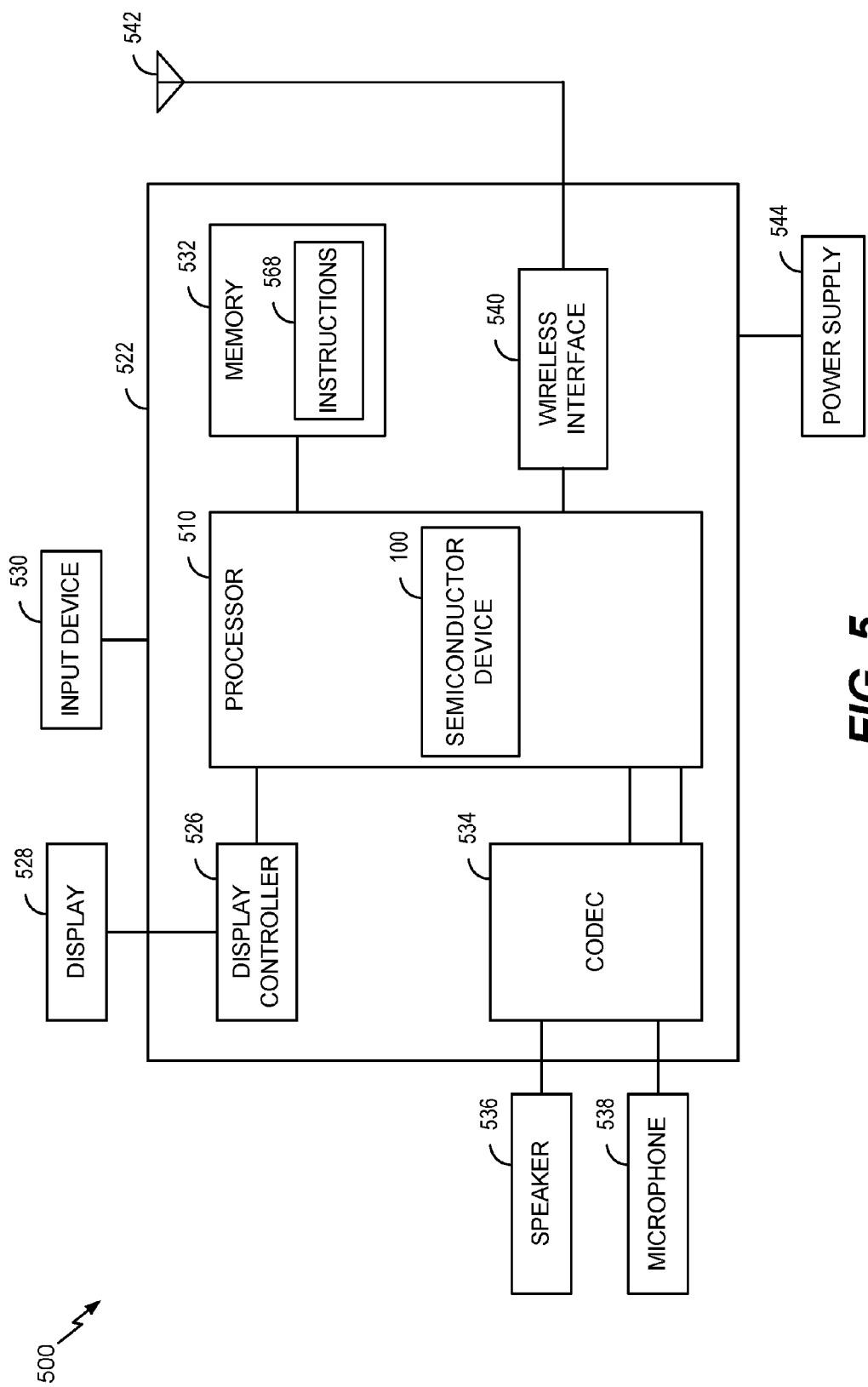
FIG. 5 is a block diagram of an electronic device including the semiconductor device of FIG. 1.

Referring to FIG. 5, a block diagram of a particular illustrative embodiment of a device 500 (e.g., an electronic device), such as a wireless communication device, is depicted. The device 500 includes a processor 510, such as a digital signal processor (DSP), coupled to a memory 532. The processor 510, or components thereof, may include the semiconductor device 100 of FIG. 1. To illustrate, the processor 510 may be constructed in such a way that components of the processor 510 may be electrically connected to one or more structures, such as a common electrode (e.g., the top electrode 110), an MTJ pillar (e.g., one of the free layers 132-138, the barrier layer 140, and the pinned layer 150), a via, and/or the bottom electrode 118 of FIG. 1, that are included in the semiconductor device 100. For example, the semiconductor device 100 may be included in a memory of the processor 510, such as a cache memory.

The memory 532 includes instructions 568 (e.g., executable instructions) such as computer-readable instructions or processor-readable instructions. The instructions 568 may include one or more instructions that are executable by a computer, such as the processor 510.

FIG. 5 also shows a display controller 526 that is coupled to the processor 510 and to a display 528. A coder/decoder (CODEC) 534 can also be coupled to the processor 510. A speaker 536 and a microphone 538 can be coupled to the CODEC 534.

FIG. 5 also indicates that a wireless interface 540 can be coupled to the processor 510 and to an antenna 542. In some implementations, the semiconductor device 100, the processor 510, the display controller 526, the memory 532, the CODEC 534, and the wireless interface 540 are included in a system-in-package or system-on-chip device 522. In a particular embodiment, an input device 530 and a power supply 544 are coupled to the system-on-chip device 522. Moreover, in a particular embodiment, as illustrated in FIG. 5, the display 528, the input device 530, the speaker 536, the microphone 538, the antenna 542, and the power supply 544 are external to the system-on-chip device 522. However, each of the display 528, the input device 530, the speaker 536, the microphone 538, the antenna 542, and the power supply 544 can be coupled to a component of the system-on-chip device 522, such as an interface or a controller. Although the semiconductor device 100 is depicted as being included in the processor 510, in other implementations, the semiconductor device 100 may be included in another component of the device 500 or a component coupled to the device 500. For example, the semiconductor device 100 may be included in the memory 532, as an illustrative, non-limiting example.

One or more of the disclosed embodiments may be implemented in a system or an apparatus, such as the electronic device 500, that may include a communications device, a fixed location data unit, a mobile location data unit, a mobile phone, a cellular phone, a satellite phone, a computer, a tablet, a portable computer, a display device, a media player, or a desktop computer. Alternatively or additionally, the electronic device 500 may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, a satellite, a vehicle, any other device that includes a processor or that stores or retrieves data or computer instructions, or a combination thereof. As another illustrative, non-limiting example, the system or the apparatus may include remote units, such as hand-held personal communication systems (PCS) units, portable data units such as global positioning system (GPS) enabled devices, meter reading equipment, or any other device that includes a processor or that stores or retrieves data or computer instructions, or any combination thereof.

Figure 6:
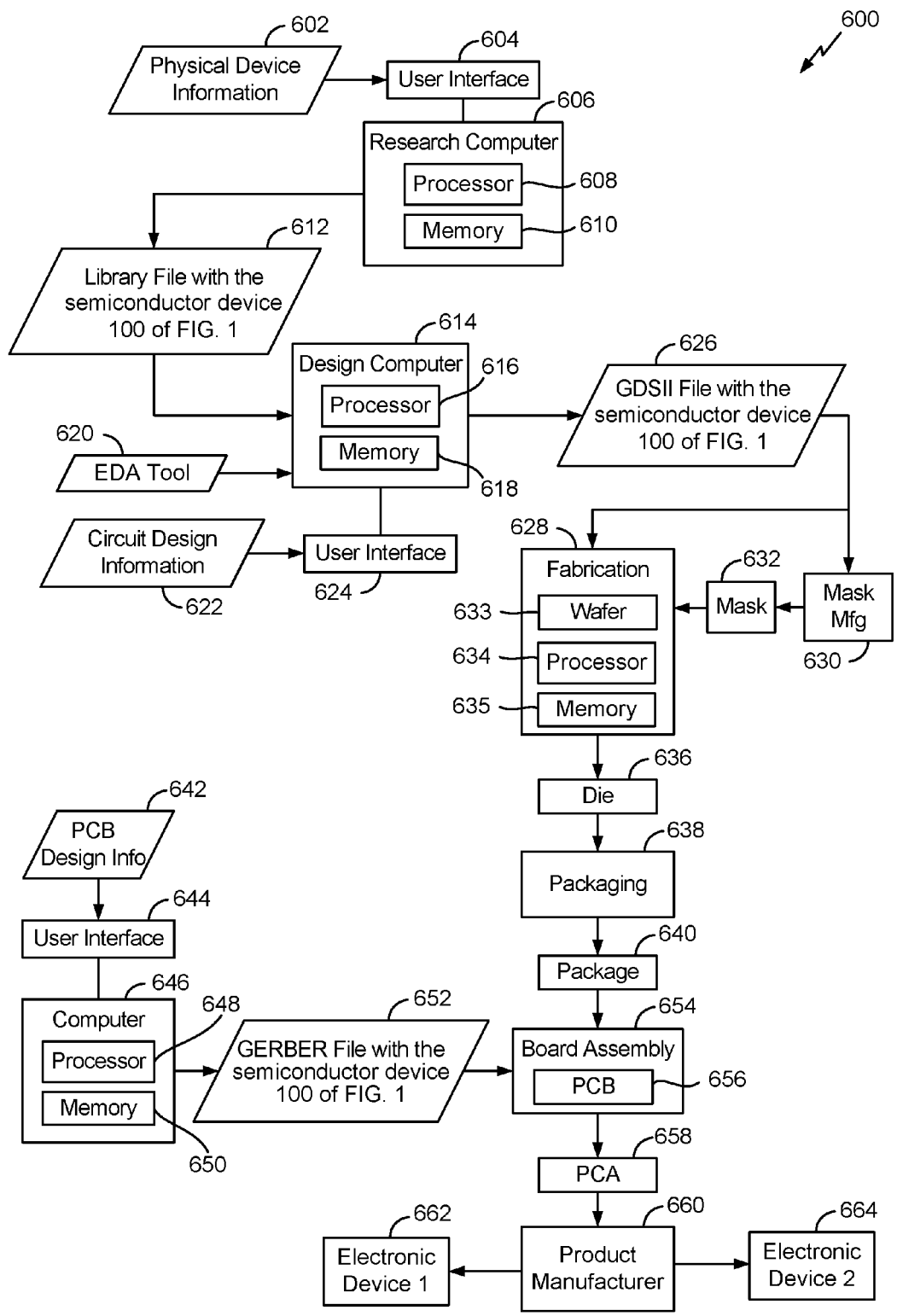
FIG. 6 is a data flow diagram of a particular illustrative embodiment of a manufacturing process to manufacture electronic devices that include a semiconductor device having an MTJ device array.

The foregoing disclosed devices and functionalities may be designed and configured into computer files (e.g. RTL, GDSII, GERBER, etc.) stored on computer-readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 6 depicts a particular illustrative embodiment of an electronic device manufacturing process 600.

Physical device information 602 is received at the manufacturing process 600, such as at a research computer 606. The physical device information 602 may include design information representing at least one physical property of the semiconductor device 100 of FIG. 1, a semiconductor device formed according to the process shown in FIGS. 2A-2E, a semiconductor device formed according to the process shown in FIGS. 3A-3E, a semiconductor device formed according to the method 400 of FIG. 4, or a combination thereof. For example, the physical device information 602 may include physical parameters, material characteristics, and structure information that is entered via a user interface 604 coupled to the research computer 606. The research computer 606 includes a processor 608, such as one or more processing cores, coupled to a computer-readable medium (e.g., a non-transitory computer-readable medium), such as a memory 610. The memory 610 may store computer-readable instructions that are executable to cause the processor 608 to transform the physical device information 602 to comply with a file format and to generate a library file 612.

In some implementations, the library file 612 includes at least one data file including the transformed design information. For example, the library file 612 may include a library of devices including a device that includes the semiconductor device 100 of FIG. 1, a semiconductor device formed according to the process shown in FIGS. 2A-2E, a semiconductor device formed according to the process shown in FIGS. 3A-3E, a semiconductor device formed according to the method 400 of FIG. 4, or a combination thereof, that is provided for use with an electronic design automation (EDA) tool 620.

The library file 612 may be used in conjunction with the EDA tool 620 at a design computer 614 including a processor 616, such as one or more processing cores, coupled to a memory 618. The EDA tool 620 may be stored as processor executable instructions at the memory 618 to enable a user of the design computer 614 to design a circuit including the semiconductor device 100 of FIG. 1, a semiconductor device formed according to the process shown in FIGS. 2A-2E, a semiconductor device formed according to the process shown in FIGS. 3A-3E, a semiconductor device formed according to the method 400 of FIG. 4, or a combination thereof. For example, a user of the design computer 614 may enter circuit design information 622 via a user interface 624 coupled to the design computer 614. The circuit design information 622 may include design information representing at least one physical property of a component (e.g., a top electrode, a via, a MTJ device, and/or a bottom electrode) of the semiconductor device 100 of FIG. 1, a semiconductor device formed according to the process shown in FIGS. 2A-2E, a semiconductor device formed according to the process shown in FIGS. 3A-3E, a semiconductor device formed according to the method 400 of FIG. 4, or a combination thereof. To illustrate, the circuit design property may include identification of particular circuits and relationships to other elements in a circuit design, positioning information, feature size information, interconnection information, or other information representing a physical property of components the semiconductor device 100 of FIG. 1, a semiconductor device formed according to the process shown in FIGS. 2A-2E, a semiconductor device formed according to the process shown in FIGS. 3A-3E, a semiconductor device formed according to the method 400 of FIG. 4, or a combination thereof.

The design computer 614 may be configured to transform the design information, including the circuit design information 622, to comply with a file format. To illustrate, the file format may include a database binary file format representing planar geometric shapes, text labels, and other information about a circuit layout in a hierarchical format, such as a Graphic Data System (GDSII) file format. The design computer 614 may be configured to generate a data file including the transformed design information, such as a GDSII file 626 that includes information describing the semiconductor device 100 of FIG. 1, a semiconductor device formed according to the process shown in FIGS. 2A-2E, a semiconductor device formed according to the process shown in FIGS. 3A-3E, a semiconductor device formed according to the method 400 of FIG. 4, or a combination thereof, in addition to other circuits or information. To illustrate, the data file may include information corresponding to a system-on-chip (SOC) that includes the semiconductor device 100 of FIG. 1, a semiconductor device formed according to the process shown in FIGS. 2A-2E, a semiconductor device formed according to the process shown in FIGS. 3A-3E, a semiconductor device formed according to the method 400 of FIG. 4, or a combination thereof, and that also includes additional electronic circuits and components within the SOC.

The GDSII file 626 may be received at a fabrication process 628 to manufacture the semiconductor device 100 of FIG. 1, a semiconductor device formed according to the process shown in FIGS. 2A-2E, a semiconductor device formed according to the process shown in FIGS. 3A-3E, a semiconductor device formed according to the method 400 of FIG. 4, or a combination thereof, according to transformed information in the GDSII file 626. For example, a device manufacture process may include providing the GDSII file 626 to a mask manufacturer 630 to create one or more masks, such as masks to be used with photolithography processing, illustrated as a representative mask 632. The mask 632 may be used during the fabrication process to generate one or more wafers 633, which may be tested and separated into dies, such as a representative die 636. The die 636 includes a circuit including a device that includes the semiconductor device 100 of FIG. 1, a semiconductor device formed according to the process shown in FIGS. 2A-2E, a semiconductor device formed according to the process shown in FIGS. 3A-3E, a semiconductor device formed according to the method 400 of FIG. 4, or a combination thereof.

For example, the fabrication process 628 may include a processor 634 and a memory 635 to initiate and/or control the fabrication process 628. The memory 635 may include executable instructions such as computer-readable instructions or processor-readable instructions. The executable instructions may include one or more instructions that are executable by a computer such as the processor 634.

The fabrication process 628 may be implemented by a fabrication system that is fully automated or partially automated. For example, the fabrication process 628 may be automated according to a schedule. The fabrication system may include fabrication equipment (e.g., processing tools) to perform one or more operations to form a semiconductor device, such as the semiconductor device 100 of FIG. 1, a semiconductor device formed according to the process shown in FIGS. 2A-2E, a semiconductor device formed according to the process shown in FIGS. 3A-3E, a semiconductor device formed according to the method 400 of FIG. 4, or a combination thereof. For example, the fabrication equipment may be configured to deposit one or more materials, etch one or more materials, etch one or more dielectric materials, perform a chemical mechanical planarization process, deposit a conductive material, etc., or a combination thereof, as illustrative, non-limiting examples.

The fabrication system (e.g., an automated system that performs the fabrication process 628) may have a distributed architecture (e.g., a hierarchy). For example, the fabrication system may include one or more processors, such as the processor 634, one or more memories, such as the memory 635, and/or controllers that are distributed according to the distributed architecture. The distributed architecture may include a high-level processor that controls or initiates operations of one or more low-level systems. For example, a high-level portion of the fabrication process 628 may include one or more processors, such as the processor 634, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the particular high-level. Each of the one or more low-level systems may be associated with one or more corresponding pieces of fabrication equipment (e.g., processing tools). In some implementations, the fabrication system may include multiple processors that are distributed in the fabrication system. For example, a controller of a low-level system component may include a processor, such as the processor 634.

Alternatively, the processor 634 may be a part of a high-level system, subsystem, or component of the fabrication system. In another implementation, the processor 634 includes distributed processing at various levels and components of a fabrication system.

Thus, the processor 634 may include processor-executable instructions that, when executed by the processor 634, cause the processor 634 to initiate or control formation of an array of MTJ devices. For example, the executable instructions included in the memory 635 may enable the processor 634 to initiate formation of the semiconductor device 100 of FIG. 1, a semiconductor device formed according to the process shown in FIGS. 2A-2E, a semiconductor device formed according to the process shown in FIGS. 3A-3E, a semiconductor device formed according to the method 400 of FIG. 4, or a combination thereof. In some implementations, the memory 635 is a non-transient computer-readable medium storing computer-executable instructions that are executable by the processor 634 to cause the processor 634 to initiate formation of a semiconductor device in accordance with at least a portion of the process shown FIGS. 2A-2E, at least a portion of the process shown in FIGS. 3A-3E, at least a portion of the method 400 of FIG. 4, or any combination thereof. For example, the computer executable instructions may be executable to cause the processor 634 to initiate or control formation of the semiconductor device 100 of FIG. 1.

As an illustrative example, the processor 634 may initiate or control a first etch and may initiate or control a second etch associated with formation of a semiconductor device. The first etch forms a first magnetic layer of a first MTJ device and forms a second magnetic layer of a second MTJ device formation. The second etch forms at least one layer of the first MTJ device and the second MTJ device. The first etch is distinct from the second etch.

The die 636 may be provided to a packaging process 638 where the die 636 is incorporated into a representative package 640. For example, the package 640 may include the single die 636 or multiple dies, such as a system-in-package (SiP) arrangement. For example, the package 640 may include or correspond to the system in package or system-on-chip device 522 of FIG. 5. The package 640 may be configured to conform to one or more standards or specifications, such as Joint Electron Device Engineering Council (JEDEC) standards.

Information regarding the package 640 may be distributed to various product designers, such as via a component library stored at a computer 646. The computer 646 may include a processor 648, such as one or more processing cores, coupled to a memory 650. A printed circuit board (PCB) tool may be stored as processor executable instructions at the memory 650 to process PCB design information 642 received from a user of the computer 646 via a user interface 644. The PCB design information 642 may include physical positioning information of a packaged semiconductor device on a circuit board, the packaged semiconductor device including the semiconductor device 100 of FIG. 1, a semiconductor device formed according to the process shown in FIGS. 2A-2E, a semiconductor device formed according to the process shown in FIGS. 3A-3E, a semiconductor device formed according to the method 400 of FIG. 4, or a combination thereof.

The computer 646 may be configured to transform the PCB design information 642 to generate a data file, such as a GERBER file 652 with data that includes physical positioning information of a packaged semiconductor device on a circuit board, as well as layout of electrical connections such as traces (e.g., metal lines) and vias (e.g., via structures), where the packaged semiconductor device corresponds to the package 640 including the semiconductor device 100 of FIG. 1, a semiconductor device formed according to the process shown in FIGS. 2A-2E, a semiconductor device formed according to the process shown in FIGS. 3A-3E, a semiconductor device formed according to the method 400 of FIG. 4, or a combination thereof. In other implementations, the data file generated by the transformed PCB design information may have a format other than a GERBER format.

The GERBER file 652 may be received at a board assembly process 654 and used to create PCBs, such as a representative PCB 656, manufactured in accordance with the design information stored within the GERBER file 652. For example, the GERBER file 652 may be uploaded to one or more machines to perform various steps of a PCB production process. The PCB 656 may be populated with electronic components including the package 640 to form a representative printed circuit assembly (PCA) 658.

The PCA 658 may be received at a product manufacture process 660 and integrated into one or more electronic devices, such as a first representative electronic device 662 and a second representative electronic device 664. For example, the first representative electronic device 662, the second representative electronic device 664, or both, may include or correspond to the device 600 of FIG. 6. As an illustrative, non-limiting example, the first representative electronic device 662, the second representative electronic device 664, or both, may include a communications device, a fixed location data unit, a mobile location data unit, a mobile phone, a cellular phone, a satellite phone, a computer, a tablet, a portable computer, or a desktop computer, into which the semiconductor device 100 of FIG. 1, a semiconductor device formed according to the process shown in FIGS. 2A-2E, a semiconductor device formed according to the process shown in FIGS. 3A-3E, a semiconductor device formed according to the method 400 of FIG. 4, or a combination thereof, is integrated.

Alternatively or additionally, the first representative electronic device 662, the second representative electronic device 664, or both, may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that includes a processor or that stores or retrieves data or computer instructions, or a combination thereof, into which the semiconductor device 100 of FIG. 1, a semiconductor device formed according to the process shown in FIGS. 2A-2E, a semiconductor device formed according to the process shown in FIGS. 3A-3E, a semiconductor device formed according to the method 400 of FIG. 4, or a combination thereof, is integrated. As another illustrative, non-limiting example, one or more of the electronic devices 662 and 664 may include remote units, such as mobile phones, hand-held personal communication systems (PCS) units, portable data units such as personal data assistants, global positioning system (GPS) enabled devices, navigation devices, fixed location data units such as meter reading equipment, any other device that includes a processor or that stores or retrieves data or computer instructions, or any combination thereof. Although FIG. 6 illustrates remote units according to teachings of the disclosure, the disclosure is not limited to these illustrated units. Embodiments of the disclosure may be suitably employed in any device which includes active integrated circuitry including memory and on-chip circuitry.

A device that includes the semiconductor device 100 of FIG. 1, a semiconductor device formed according to the process shown in FIGS. 2A-2E, a semiconductor device formed according to the process shown in FIGS. 3A-3E, a semiconductor device formed according to the method 400 of FIG. 4, or a combination thereof, may be fabricated, processed, and incorporated into an electronic device, as described in the illustrative process 600. One or more aspects of the embodiments disclosed with respect to FIGS. 1-6 may be included at various processing stages, such as within the library file 612, the GDSII file 626 (e.g., a file having a GDSII format), and the GERBER file 652 (e.g., a file having a GERBER format), as well as stored at the memory 610 of the research computer 606, the memory 618 of the design computer 614, the memory 650 of the computer 646, the memory of one or more other computers or processors (not shown) used at the various stages, such as at the board assembly process 654, and also incorporated into one or more other physical embodiments such as the mask 632, the die 636, the package 640, the PCA 658, other products such as prototype circuits or devices (not shown), or any combination thereof. Although various representative stages of production from a physical device design to a final product are depicted, in other embodiments fewer stages may be used or additional stages may be included. Similarly, the process 600 may be performed by a single entity or by one or more entities performing various stages of the process 600.

Although one or more of FIGS. 1-6 may illustrate systems, apparatuses, and/or methods according to the teachings of the disclosure, the disclosure is not limited to these illustrated systems, apparatuses, and/or methods. One or more functions or components of any of FIGS. 1-6 as illustrated or described herein may be combined with one or more other portions of another of FIGS. 1-6. Accordingly, no single embodiment described herein should be construed as limiting and embodiments of the disclosure may be suitably combined without departing from the teachings of the disclosure.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. For example, a storage medium may be coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method of forming a magnetic tunnel junction (MTJ) device array including a first MTJ device and a second MTJ device, the method comprising:
   performing a first etch, wherein the first etch forms a first magnetic layer of a first MTJ device and forms a second magnetic layer of a second MTJ device; and
   performing a second etch, wherein the second etch forms a pinned magnetic layer common to the first MTJ device and the second MTJ device, and wherein at least a portion of the pinned magnetic layer is interposed between the first magnetic layer and the second magnetic layer.

2. The method of claim 1, wherein the second etch further forms a barrier layer.

3. The method of claim 2, wherein at least a portion of the barrier layer is physically positioned between the first magnetic layer and the second magnetic layer.

4. The method of claim 1, wherein the first magnetic layer includes a first free layer and the second magnetic layer includes a second free layer.

5. The method of claim 1, further comprising ending performance of the first etch, wherein the first etch is performed and completed prior to the second etch being performed.

6. The method of claim 1, further comprising:
   forming an electrode that is common to the first MTJ device and the second MTJ device; and
   forming a via configured to directly couple the pinned magnetic layer to the electrode.

7. The method of claim 1, further comprising depositing a barrier layer material and a pinned layer material.

8. The method of claim 6, wherein the electrode is formed after the second etch is performed, and wherein the electrode comprises a top electrode.

9. The method of claim 1, wherein performing the first etch and performing the second etch are initiated at or controlled by a controller of a fabrication system and wherein the portion of the pinned magnetic layer is physically positioned between the first magnetic layer and the second magnetic layer.

10. A computer-readable storage device that stores instructions that, when executed by a processor, cause the processor to perform operations including:
    initiating a first etch, wherein the first etch forms a first magnetic layer of a first MTJ device and forms a second magnetic layer of a second MTJ device; and
    initiating a second etch, wherein the second etch forms a common pinned magnetic layer for the first MTJ device and the second MTJ device, and wherein at least a portion of the common pinned magnetic layer is interposed between the first magnetic layer and the second magnetic layer.

11. The computer-readable storage device of claim 10, wherein the second etch further forms a barrier layer, wherein a first portion of the barrier layer is interposed between the portion of the common pinned magnetic layer and the first magnetic layer, and wherein a second portion of the barrier layer is interposed between the portion of the common pinned magnetic layer and the second magnetic layer.

12. The computer-readable storage device of claim 10, wherein the second etch further forms a barrier layer, wherein at least a portion of the barrier layer is positioned between the first magnetic layer and the second magnetic layer, and wherein the barrier layer is in contact with multiple surfaces of the first magnetic layer, in contact with multiple surfaces of the second magnetic layer, or both.

13. The computer-readable storage device of claim 10, wherein the first magnetic layer includes a first free layer and the second magnetic layer includes a second free layer.

14. The computer-readable storage device of claim 10, wherein the operations further include ending performance of the first etch, wherein the first etch is performed and completed prior to the second etch being performed.

15. The computer-readable storage device of claim 10, wherein the operations further comprise initiating formation of an electrode that is common to the first MTJ device and the second MTJ device.

16. The computer-readable storage device of claim 10, wherein the operations further comprise:
    initiating deposition of a pinned magnetic material in etched portions of the first and second magnetic layers; and
    initiating deposition of a barrier layer material.

17. A method comprising:
    receiving a data file including design information corresponding to a semiconductor device; and
    fabricating the semiconductor device according to the design information, wherein the semiconductor device includes an array of magnetic tunnel junction (MTJ) devices, wherein the array of MTJ devices includes:
        a first MTJ device comprising a barrier layer and a pinned magnetic layer;
        a second MTJ device comprising the barrier layer and the pinned magnetic layer;
        a top electrode coupled to the first MTJ device and the second MTJ device; and
        a via that couples the pinned magnetic layer to the top electrode.

18. The method of claim 17, wherein the pinned magnetic layer is positioned between the barrier layer and the top electrode.

19. The method of claim 17, wherein at least a portion of the pinned magnetic layer is positioned between the first MTJ device and the second MTJ device.

20. The method of claim 17, wherein the first MTJ device includes a first free layer, and wherein the second MTJ device includes a second free layer, and wherein the data file has a GDSII format.

* * * * *